(12) United States Patent
Park

(10) Patent No.: US 12,137,557 B2
(45) Date of Patent: Nov. 5, 2024

(54) SEMICONDUCTOR MEMORY DEVICE INCLUDING ACTIVE REGIONS FOR REDUCING DISTURBANCE

(71) Applicant: SK hynix Inc., Icheon-si (KR)

(72) Inventor: Sung Kun Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 132 days.

(21) Appl. No.: 17/736,226

(22) Filed: May 4, 2022

(65) Prior Publication Data

US 2023/0118978 A1   Apr. 20, 2023

(30) Foreign Application Priority Data

Oct. 20, 2021   (KR) .................. 10-2021-0140122

(51) Int. Cl.
| | | |
|---|---|---|
| *G11C 16/04* | (2006.01) | |
| *G11C 16/14* | (2006.01) | |
| *G11C 16/26* | (2006.01) | |
| *H01L 29/423* | (2006.01) | |
| *H10B 41/10* | (2023.01) | |
| *H10B 41/35* | (2023.01) | |

(Continued)

(52) U.S. Cl.
CPC .......... *H10B 41/35* (2023.02); *G11C 16/0433* (2013.01); *G11C 16/14* (2013.01); *G11C 16/26* (2013.01); *H01L 29/42328* (2013.01); *H10B 41/10* (2023.02); *G11C 16/08* (2013.01); *G11C 16/24* (2013.01)

(58) Field of Classification Search
CPC ........ H10B 41/35; H10B 41/10; H10B 41/60; H10B 41/70; G11C 16/0433; G11C 16/14; G11C 16/26; G11C 16/08; G11C 16/24; G11C 16/10; H01L 29/42328
USPC ...................................... 365/185.05
See application file for complete search history.

(56) References Cited

U.S. PATENT DOCUMENTS

| | | | |
|---|---|---|---|
| 7,046,549 B2 | 5/2006 | Lee et al. | |
| 7,200,038 B2 * | 4/2007 | Lee ................... | G11C 16/3468 365/185.11 |

(Continued)

OTHER PUBLICATIONS

Park, S.K. et al., "Improved Performance of Novel Vertical Assist Operating Select Gate Lateral Coupling Cell for Logic Nonvolatile Memory." IEEE Electron Device Letters, vol. 37, No. 4, Apr. 2016, 4 pages.

(Continued)

*Primary Examiner* — Tha-O H Bui
(74) *Attorney, Agent, or Firm* — Perkins Coie LLP

(57) ABSTRACT

A semiconductor memory device may include a second conductive type first well, a second conductive type third well, a first conductive type second well, a floating gate and a selection gate. The first well may include a first active region. The third well may include a third active region. The second well may be arranged between the first well and the third well. The second well may include a second active region. The floating gate may be overlapped with the first active region, the second active region and the third active region. The selection gate may be overlapped with the second active region. The selection gate and the floating gate may be arranged side by side. A second overlap area between the second active region and the floating gate may be larger than a third overlap area between the third active region and the floating gate.

20 Claims, 8 Drawing Sheets

(51) Int. Cl.
  *G11C 16/08* (2006.01)
  *G11C 16/24* (2006.01)

(56) References Cited

U.S. PATENT DOCUMENTS

| | | |
|---|---|---|
| 7,233,527 B2 | 6/2007 | Lee et al. |
| 7,839,683 B2 | 11/2010 | Oka et al. |
| 9,041,089 B2 * | 5/2015 | Chen ...................... H10B 41/10 |
| | | 257/315 |
| 2020/0194079 A1 * | 6/2020 | Chen ...................... G11C 16/14 |

OTHER PUBLICATIONS

Park, S.K., "Analysis of Program Disturbance Immunity of VA-SGLC Embedded Nonvolatile Memory." IEEE Transactions on Electron Devices, vol. 67, No. 10, Oct. 2020, 4 pages.

* cited by examiner

SEMICONDUCTOR MEMORY DEVICE INCLUDING ACTIVE REGIONS FOR REDUCING DISTURBANCE

PRIORITY CLAIM AND CROSS-REFERENCES TO RELATED APPLICATION

This patent document claims the priority and benefits of Korean application number 10-2021-0140122, filed on Oct. 20, 2021, in the Korean Intellectual Property Office, which is incorporated herein by reference in its entirety.

TECHNICAL FIELD

Various embodiments of the disclosed technology generally relate to a semiconductor memory device, more particularly, to a non-volatile memory device.

BACKGROUND

Life environments may easily use desired information whenever and wherever due to recent digital media devices. As a non-memory semiconductor may have been highly integrated, a system on chip (SoC) field may be interested. A global semiconductor industry may perform investment competition so as to improve SoC-based technologies. The SoC may include one semiconductor on which all system technologies may be integrated. When system design technologies may not be secured, it may be difficult to develop the non-memory semiconductor.

A typical one of the SoC field in which complicated technologies may be integrated may be an embedded memory. A spotlighted memory of the embedded memory may be an electrically erasable programmable read-only memory (EEPROM). The EEPROM may be a highly integrated non-volatile memory device configured to store data, erase and program the data without a power similarly to a read-only memory (ROM). Because the EEPROM has low power consumption and high-speed programmability, it is mainly used in products that require frequent memory changes.

SUMMARY

In one embodiment, a semiconductor memory device may include a semiconductor substrate; a first well supported by the semiconductor substrate and structured to include a first active region and doped to exhibit a first conductive type; a second well supported by the semiconductor substrate and arranged at a side of the first well, the second well structured to include a second active region and doped to exhibit a second conductive type different from the first conductive type; a third well supported by the semiconductor substrate and arranged at a side of the second well, the third well structured to include a third active region and doped to exhibit the first conductive type of the first well; a floating gate supported by the semiconductor substrate and positioned to overlap with the first active region, the second active region and the third active region, and a selection gate supported by the semiconductor substrate and positioned to overlap with the second active region and arranged at a side of the floating gate. A second overlapping area between the second active region and the floating gate is larger than a third overlapping area between the third active region and the floating gate.

In one embodiment, a semiconductor memory device may include a memory transistor including a floating gate, the floating gate including a first capacitor, a second capacitor and a third capacitor that are connected in series; a selection transistor connected with the memory transistor in series, the selection transistor including a selection gate electrically connected to a selection line; a bit line electrically connected to the memory transistor; a source line electrically connected to the selection transistor; a word line electrically connected to the first capacitor of the floating gate; an erase line electrically connected to the third capacitor of the floating gate. a capacitance of the first capacitor is larger than the a capacitance of the third capacitor.

In one embodiment, a semiconductor memory device may include a cell array. The cell array may include a plurality of unit cells having a matrix shape that is extended in a first direction and a second direction intersecting the first direction. Each of the unit cells may include a first well including a first active region extended in the first direction and doped to exhibit a first conductive type, a second well arranged beside the first well in a second direction intersecting with the first direction, the second well including a second active region extended in the first direction and doped to exhibit a second conductive type that is opposite to the first conductive type of the first well; a third well arranged beside the second well in the second direction, the third well including a third active region and doped to exhibit a third conductive type that is the same with the first conductive type of the first well; a floating gate overlapping with the first active region, the second active region and the third active region, the floating gate extended in the second direction; a selection gate overlapped with the second active region and arranged side by side with the floating gate along the first direction. Four adjacent unit cells are arranged to share the third active region.

BRIEF DESCRIPTION OF THE DRAWINGS

The above and another aspects, features and advantages of the subject matter of the present disclosure will be more clearly understood from the following detailed description taken in conjunction with the accompanying drawings.

DETAILED DESCRIPTION

Various embodiments of the disclosed technology will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes.

The disclosed technology is described herein with reference to cross-section and/or plan illustrations of embodiments of the disclosed technology. Although a few embodiments of the disclosed technology will be shown and described, it will be appreciated by those of ordinary skill in the art that further changes may be made in these embodiments.

Example embodiments may provide a non-volatile memory device easily applied to an embedded memory that may be capable of improving operational reliability. The embedded memory may include a semiconductor memory device configured to trim an analog device or store an internal calculation algorithm with a recently spotlighted chip including a digital circuit and an analog circuit embedded with each other to perform complicated functions in an SoC (system on a chip) field including complicated technologies.

Dopants of different first and second conductive types are used to dope (or implant) a region or well in a semiconductor device wherein the first conductive type and second conductive type may be complementary conductive types to each other. When the first conductive type may be a P type, the second conductive type may be an N type. When the first conductive type may be the N type, the second conductive type may be the P type. In example embodiments, the first conductive type may be the P type and the second conductive type may be the N type.

Further, a first direction and a second direction may be intersected with each other. For example, the first direction may be an X-direction and the second direction may be a Y-direction in an XY coordinate.

Figure 1:
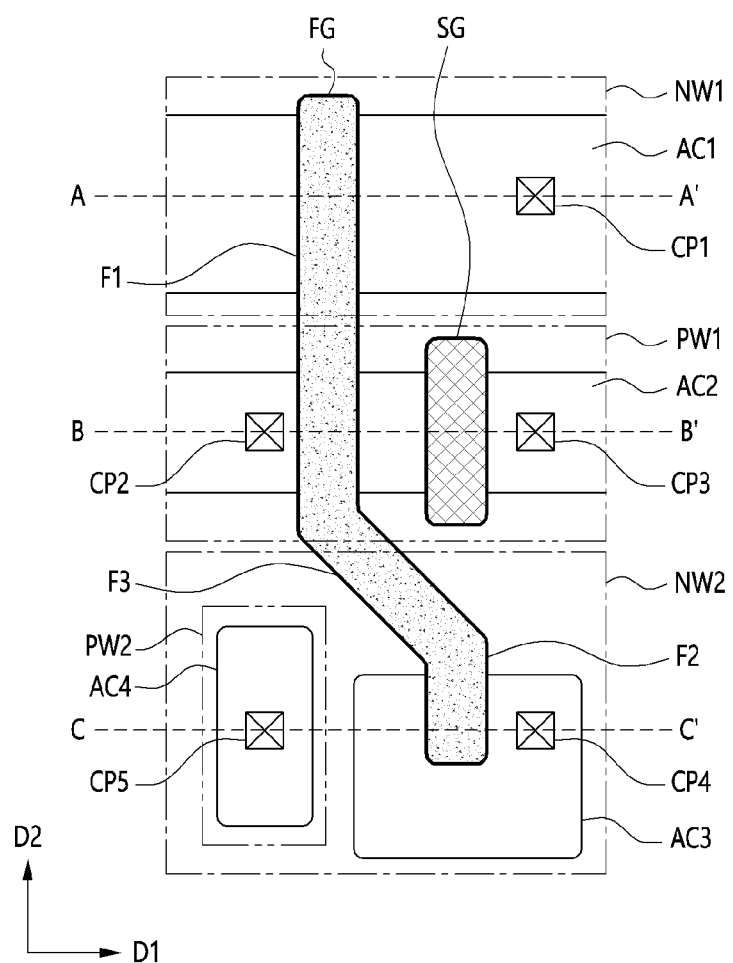
FIG. 1 is a plan view illustrating a unit cell of a semiconductor memory device in accordance with example embodiments of the disclosed technology.

FIG. 1 is a plan view illustrating a unit cell of a semiconductor memory device in accordance with example embodiments.

Referring to FIG. 1, a unit cell 10 of a semiconductor memory device in accordance example embodiments may include a first doped region NW1 as a first well, a second doped region PW1 as a second well, a third doped region NW2 as a third well and a fourth doped region PW2 as a fourth well, all supported by a semiconductor substrate. The first well NW1 may include a first active region AC1. The second well PW1 may include a second active region AC2. The third well NW2 may include a third active region AC3. The fourth well PW2 may include a fourth active region AC4. The unit cell 10 may further include a floating gate FG and a selection gate SG. The floating gate FG may be formed on the first active region AC1, the second active region AC2 and the third active region AC3. The selection gate SG may be formed on the second active region AC2.

The second well PW1 and the fourth well PW2 may have a first conductive type. The first well NW1 and the third well NW2 may have a second conductive type. For example, the first well NW1 and the third well NW2 may be an N well. For example, the second well PW1 and the fourth well PW2 may be a P well. The first well NW1 and the third well NW2 may have a linear shape (or stripe shape) extended in a first direction D1. The first well NW1 and the third well NW2 may be arranged side by side in a second direction D2. The fourth well PW2 may have an island shape arranged in the third well NW2.

The first well NW1, the second well PW1 and the third well NW2 may be positioned adjacent to each other along the second direction D2. Particularly, the first well NW1 may be positioned adjacent to the second well PW1 along the second direction D2. The second well PW1 may be positioned adjacent to the third well NW2 along the second direction D2. Thus, a plurality of wells having the different conductive types may be alternately arranged in the second direction D2. The plurality of wells having the different conductive types may be electrically isolated each other. Because the plurality of wells having the different conductive types may be alternately arranged along the second direction D2, an area of the unit cell 10 may be reduced. Further, the fourth well PW2 in the third well NW2 may be isolated from the third well NW2 by an isolation layer (not shown).

The first active region AC1 in the first well NW1 may be defined by the isolation layer. The first active region AC1 may be extended in the first direction D1. A plurality of unit cells 10 may share the first active region AC1 in common. The first active region AC1 may be used for a program operation and a read operation of the unit cell 10. The first active region AC1 may be used as an active control gate ACG to control the floating gate FG. The first active region AC1 may be electrically connected to a word line through a first contact plug CP1. When the unit cells 10 may commonly share the first active region AC1, the first active region AC1 may be used as the word line (not shown). The floating gate FG may formed on the first active region AC1. An overlap area between the first active region AC1 and the floating gate FG may be referred to as a first overlap area.

The second active region AC2 in the second well PW1 may be defined by the isolation layer. The second active region AC2 may be extended in the first direction D1. The second active region AC2 may be spaced apart from the first active region AC1 side by side along the second direction D2. The plurality of unit cells 10 may commonly share the second active region AC2. The second active region AC2 may be used for the read operation of the unit cell 10. The second active region AC2 may be electrically connected to a bit line (not shown) through a second contact plug CP2 adjacent to the floating gate FG. The second active region AC2 may be electrically connected to a source line (not shown) through a third contact plug CP3 adjacent to the selection gate SG. The floating gate FG and the selection gate SG may be formed on the second active region AC2. An overlap area between the second active region AC2 and the floating gate FG may be referred to as a second overlap area. For example, the second overlap area may be the same as or smaller than the first overlap area, to apply a different bias to the floating gate FG according to memory operations.

The third active region AC3 in the third well NW2 may be defined by a isolation layer. The third active region AC3 may have an island shape. The third active region AC3 may be aligned with the selection gate SG in the second direction D2. The third active region AC3 may be used for the program operation and the erase operation of the unit cell 10. The third active region AC3 may be used as the active control gate ACG to control the floating gate FG together with the first active region AC1. The third active region AC3 may be electrically connected to an erase line through a fourth contact plug CP2 adjacent to the floating gate FG. The third active region AC2 may be electrically connected to the source line through a fourth contact plug CP4. The floating gate FG may be extended to overlap the third active region AC3. An overlap area between the third active region AC3 and the floating gate FG may be referred to as a third overlap area. For example, the third overlap area may be smaller than the second overlap area.

The fourth active region AC4 in the fourth well PW2 may be defined by the isolation layer. The fourth active region AC4 may have an island shape. For example, a side of the fourth active region AC4 may be faced to a side of the third active region AC3. The fourth active region AC4 may prevent an interference between the adjacent unit cells 10 and stabilize an electric potential of the substrate (not shown). The fourth active region AC2 may be electrically connected to a well tap line (not shown) through a fifth contact plug CP5.

The selection gate SG may have a linear shape extended in the second direction D2. The selection gate SG and the floating gate FG may be arranged along the first direction D1 in substantially parallel. Although not depicted in drawings, the selection gate SG may be electrically connected with a selection line (not shown) on the selection gate SG through a contact plug.

The floating gate FG may have a linear shape extended in the second direction D2. As described above, the floating gate FG may be overlapped with the first active region AC1, the second active region AC2 and the third active region AC3 In order to provide a space for forming the fourth active region AC4 and easily share the second active region AC2 by the adjacent unit cells 10, the floating gate FG may include a bent portion. For example, the bent portion of the floating gate FG may be aligned with the selection gate SG. The floating gate FG may include a first region F1 overlapped with the first active region AC1 and the second active region AC2, a second region F2 overlapped with the third active region AC3 and a third region F3 arranged between the first region F1 and the second region F2. The first region F1 and the second region F2 of the floating gate FG may be parallel each other. The first region F1 of the floating gate FG and the selection gate SG may be arranged side by side along the first direction D1. The second region F2 of the floating gate FG may be aligned with the selection gate SG in the second direction D2. In order to connect the first region F1 and the second region F2 through the third region F3, the third region F3 of the floating gate FG may be the bent portion slantly to the first direction D1 or the second direction D2.

Figure 2A:
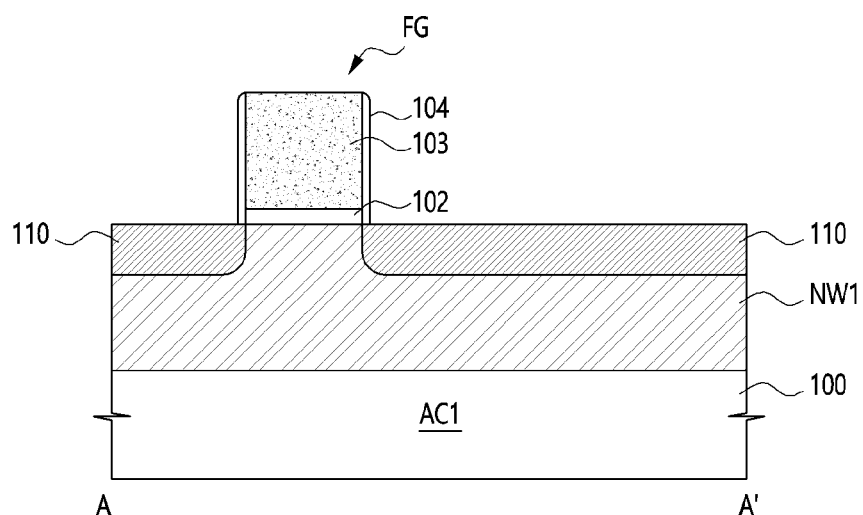
FIG. 2A is a cross-sectional view taken along a line A-A' in FIG. 1 of the disclosed technology.
Figure 2B:
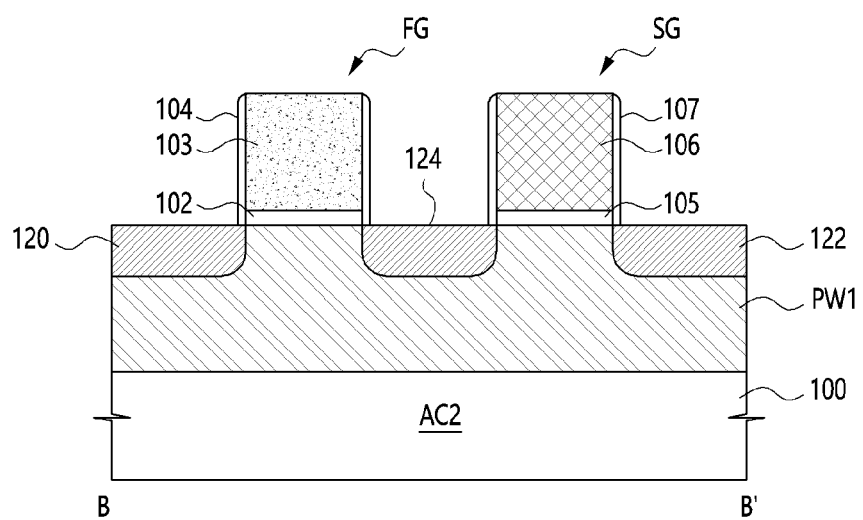
FIG. 2B is a cross-sectional view taken along a line B-B' in FIG. 1 of the disclosed technology.
Figure 2C:
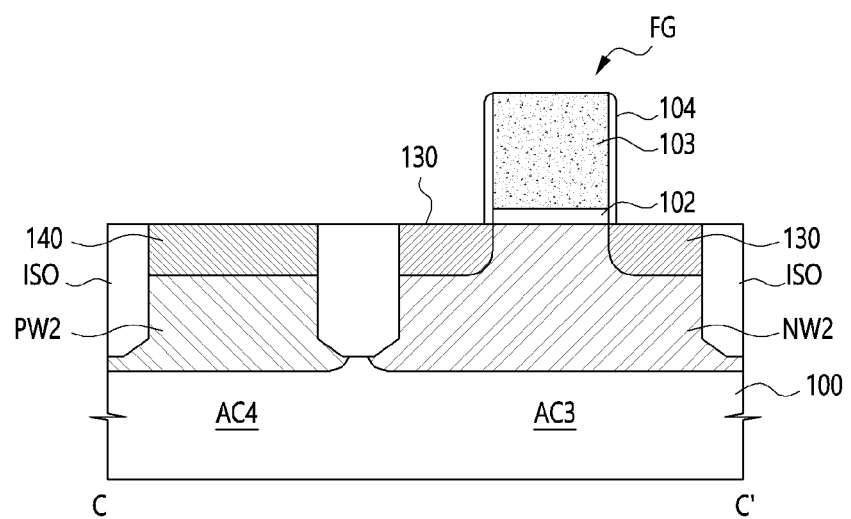
FIG. 2C is a cross-sectional view taken along a line C-C' in FIG. 1 of the disclosed technology.

FIG. 2A is a cross-sectional view taken along a line A-A' in FIG. 1, FIG. 2B is a cross-sectional view taken along a line B-B' in FIG. 1 and FIG. 2C is a cross-sectional view taken along a line C-C' in FIG. 1.

Referring to FIGS. 1 and 2A, the unit cell 10 may include a semiconductor substrate 100, the first well NW1, the first active region AC1, the floating gate FG and a first junction region 110. The first well NW1 may be formed in the substrate 100. The first well NW1 may have the first conductive type. The first active region AC1 may be defined by the isolation layer (not shown) formed in the substrate 100. The floating gate FG may be formed on the substrate 100. The floating gate FG may be overlapped with the first active region AC1. The first junction region 110 may be formed in portions of the substrate 100 in the first active region AC1 at both sides of the floating gate FG.

The substrate 100 may include a semiconductor substrate. The semiconductor substrate may include a single crystalline state. The semiconductor substrate may include a silicon-containing material. For example, the substrate 100 may include a bulk silicon substrate, a supporting substrate, a silicon-on-insulator (SOI) substrate including a buried insulating layer, or a single crystalline silicon layer alternately stacked, etc.

The floating gate FG may be formed on the substrate 100. The floating gate FG may be overlapped with the first active region AC1. The floating gate FG may include a first gate insulating layer 102, a first gate conductive layer 103 and a first spacer 104. The first gate conductive layer 103 may include a polysilicon material. The first junction region 110 may include an impurity region having the second conductive type. The first junction region 110 may have a conductive type substantially the same as the conductive type of the first well NW1. The first junction region 110 may have an impurity doping concentration higher than an impurity doping concentration of the first well NW1. The first contact plug CP1 may be electrically connected to the first junction region 110.

The first junction region 110 configured to make contact with the first contact plug CP1 may further include a first conductive type impurity region configured to make contact with the second conductive type impurity region. Thus, the first junction region 110 overlapping with the first contact plug CP1 may have a butting structure including the first conductive type impurity region and the second conductive type impurity region making contact with each other.

Referring to FIGS. 1 and 2B, the unit cell 100 may include the substrate 100, the first conductive type second well PW1, the second active region AC2, the floating gate FG and the selection gate SG. The second well PW1 may be formed in the substrate 100. The second active region AC2 may be defined by the isolation layer (not shown). The floating gate FG may be formed on the substrate 100. The floating gate FG may be overlapped with the second active region AC2. The selection gate SG may be formed on the substrate 100. The selection gate SG may be overlapped with the second active region AC2. The selection gate SG may be spaced apart from the floating gate FG. The unit cell 10 may further include a second junction region 120, a third junction region 122 and a fourth junction region 124. The second junction region 120 may be formed in a portion of the second active region AC2 corresponding to one side of the floating gate FG. The third junction region 122 may be formed in a portion of the second active region AC2 corresponding the other side of the selection gate SG. The fourth junction region 124 may be formed in a portion of the second active region AC2 between the floating gate FG and the selection gate SG.

The first well NW1 and the second well PW1 may have substantially the same depth from a surface of the substrate 100. The floating gate FG overlapped with the second active region AC2, may include the first gate insulating layer 102, the first gate conductive layer 103 and the first spacer 104. The selection gate SG overlapped with the second active region AC2, may include a second gate insulating layer 105, a second gate conductive layer 106 and a second spacer 107. The floating gate FG and the selection gate SG may be simultaneously formed by a same process. For example, each of the first gate insulating layer 102, the first gate conductive layer 103 and the first spacer 104 may be same with the second gate insulating layer 105, the second conductive layer 106 and the second spacer 107, respectively. The second junction region 120, the third junction region 122 and the fourth junction region 124 may include an impurity region having the second conductive type. The second junction region 120 may be electrically connected to the second contact plug CP2. The third junction region 122 may be electrically connected to the third contact plug CP3. The fourth junction region 124 may function as to electrically connect a first channel formed by the floating gate FG with a second channel formed by the selection gate SG.

Referring to FIGS. 1 and 2C, the unit cell 100 may include the substrate 100, the second conductive type third well NW2, the first conductive type fourth well PW2, the third active region AC3, the fourth active region AC4 and the floating gate FG. The third well NW2 may be formed in the third active region AC3 of the substrate 100. The fourth well PW2 may be formed in the fourth active region AC4 of the substrate 100. The third and fourth active regions AC3 and AC4 may be defined by the isolation layer ISO. The floating gate FG may be formed on the third active region AC3. The unit cell 10 may further include a fifth junction region 130 and a sixth junction region 140. The fifth junction region 130 may be formed in portions of the third well NW2 corresponding to the one side of the floating gate FG. The sixth junction region 140 may be formed in portions of the fourth well PW2 corresponding to the fourth active region AC4.

The first well NW1, the second well PW1, the third well NW2 and the fourth well PW2 may have substantially the same depth from a surface of the substrate 100. The isolation layer ISO may have a shallow trench isolation (STI). For example, the isolation layer ISO may include a trench and an isolating insulating layer filled in the trench. The isolation layer ISO may have a depth shallower than the depth of the first to fourth wells NW1, PW1, NW2 and PW2. The floating gate FG overlapped with the third active region AC3, may include the first gate insulating layer 102, the first gate conductive layer 103 and the first spacer 104. The fifth junction region 130 may include a second conductive type impurity region. The fifth junction region 130 may have a conductive type substantially the same as the conductive type of the third well NW2. The fifth junction region 130 may have an impurity doping concentration higher than an impurity doping concentration of the third well NW2. The sixth junction region 140 may have a conductive type substantially the same as the conductive type of the fourth well PW2. The sixth junction region 140 may have an impurity doping concentration higher than an impurity doping concentration of the fourth well PW2. The fifth junction region 130 may be electrically connected to the fourth contact plug CP4. The sixth junction region 140 may be electrically connected to the fifth contact plug CP5.

The fifth junction region 130 configured to make contact with the fourth contact plug CP4 may further include a first conductive type impurity region. Thus, the fifth junction region 130 overlapped with the fourth contact plug CP4 may have a butting structure including the first conductive type impurity region and the second conductive type impurity region making contact with each other.

Figure 3:
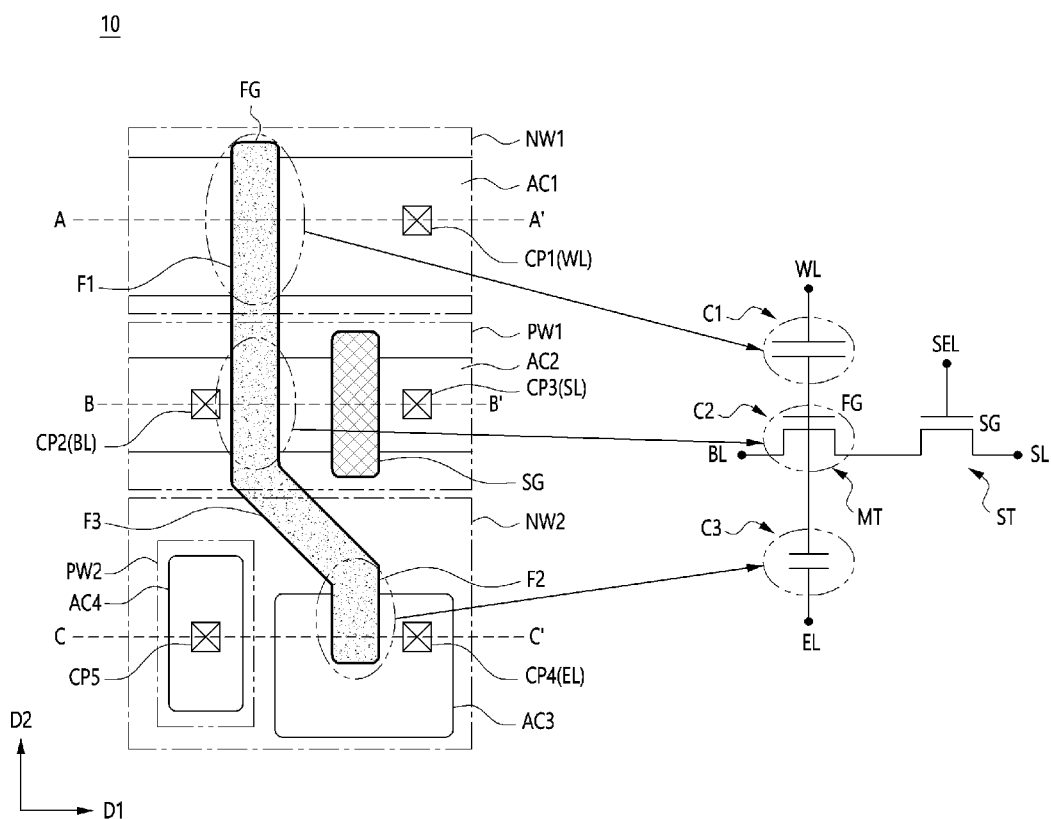
FIG. 3 is an equivalent circuit diagram illustrating a unit cell of a semiconductor memory device in accordance with example embodiments of the disclosed technology.

FIG. 3 is an equivalent circuit diagram illustrating a unit cell of a semiconductor memory device in accordance with example embodiments.

Referring to FIG. 3, the unit cell 10 may include a memory transistor MT and a selection transistor ST. The memory transistor MT may include the floating gate FG. The selection transistor ST may be serially connected with the memory transistor MT. The selection transistor ST may include the selection gate SG. The memory transistor MT and the selection transistor ST may be configured to connect a bit line BL with a source line SL. The bit line BL may be electrically connected to the memory transistor MT. The source line SL may be electrically connected to the selection transistor ST. The selection gate SG of the selection transistor ST may be electrically connected to a selection line SEL.

The floating gate FG of the memory transistor MT may include a first capacitor C1, a second capacitor C2 and a third capacitor C3 that are electrically connected in series. For example, the floating gate FG may include an electrode of the first capacitor C1, an electrode of the second capacitor C2 and an electrode of the third capacitor C3. The first capacitor C1 may be formed by an overlap region between the first active region AC1 and the floating gate FG. Thus, the first capacitor C1 may have a capacitance determined by the first overlap area. The second capacitor C2 may be formed by an overlap region between the second active region AC2 and the floating gate FG. Thus, the second capacitor C2 may have a capacitance determined by the second overlap area. The second overlap area may be equal to or less than the first overlap area. Therefore, the capacitance of the second capacitor C2 may be equal to or less than the capacitance of the first capacitor C1. The third capacitor C3 may be formed by an overlap region between the third active region AC3 and the floating gate FG. Thus, the third capacitor C3 may have a capacitance determined by the third overlap area. The third overlap area may be less than the second overlap area. Therefore, the capacitance of the third capacitor C3 may be less than the capacitance of the second capacitor C2.

A coupling ratio of the floating gate FG is controlled by configuring the first to third capacitors C1, C2 and C3 to have different capacitances from one another. Configuring the first to third capacitors C1, C2 and C3 to have different capacitances allow to control the magnitudes of the bias voltages for different operations, thereby improving the operational reliability. Thus, the capacitances of the first to third capacitors C1, C2 and C3 may be controlled to readily control the magnitude of the bias voltage applied to the floating gate FG depending on which operation is being performed on a memory cell. In some implementations, the first to third overlap areas may be controlled to readily control the magnitude of the bias voltage applied to the floating gate FG depending on a type of operation without making any changes to manufacturing processes. The type of operation may refer to a specific operation that is one of a program operation, a read operation, or an erase operation.

One ends of the first to third capacitors C1, C2 and C3 that are serially connected with one another may be electrically connected to the word line WL. The other ends of the first to third capacitors C1, C2 and C3 may be electrically connected to the erase line EL. In some implementations, the word line WL may be electrically connected to the first capacitor C1 and the source line SL may be electrically connected to the third capacitor C3.

Hereinafter, operations for controlling the magnitude of the bias voltage applied to the floating gate FG for a particular operation may be illustrated in detail with regard to FIGS. 4A to 4C.

Figure 4A:
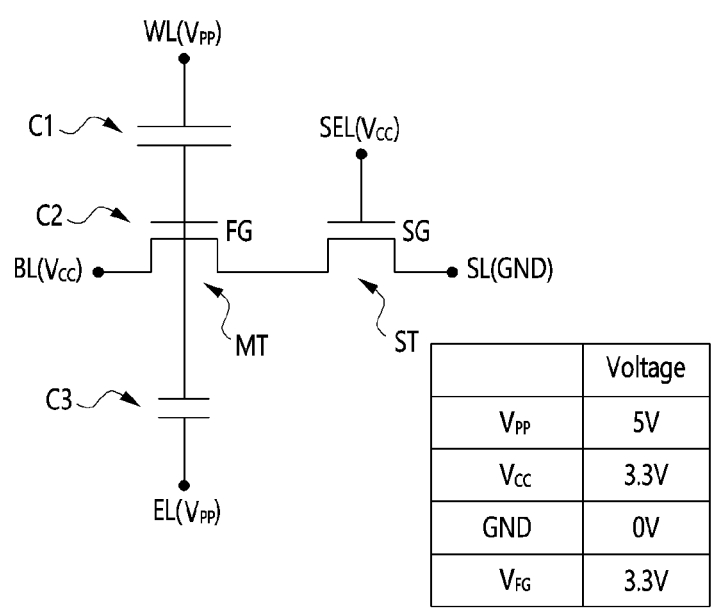
FIG. 4A is an equivalent circuit diagram illustrating a program operation of a unit cell in a semiconductor memory device in accordance with example embodiments of the disclosed technology.
Figure 4B:
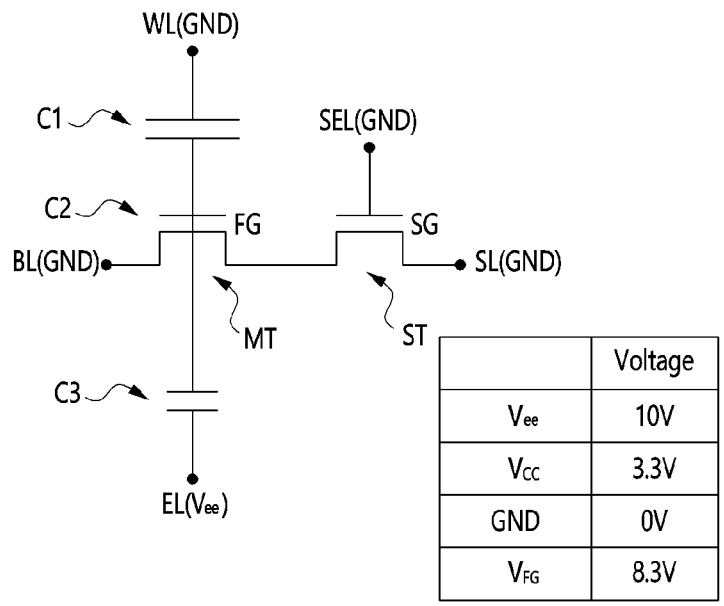
FIG. 4B is an equivalent circuit diagram illustrating an erase operation of a unit cell in a semiconductor memory device in accordance with example embodiments of the disclosed technology.
Figure 4C:
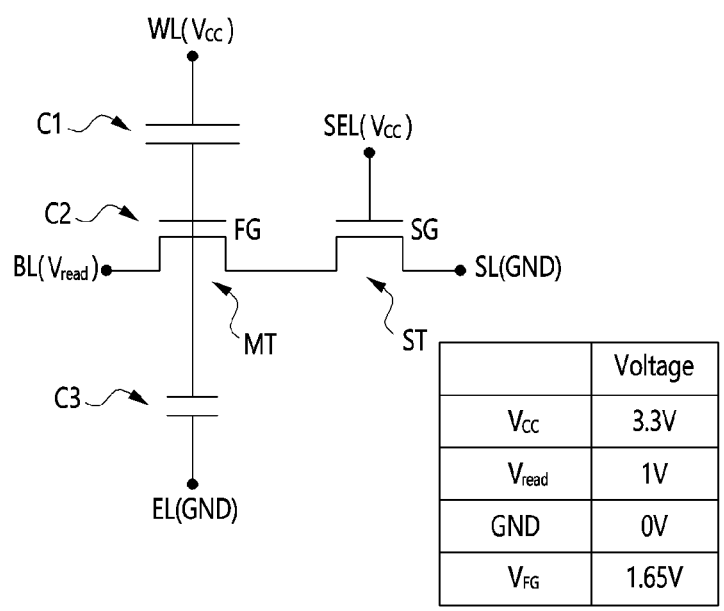
FIG. 4C is an equivalent circuit diagram illustrating a read operation of a unit cell in a semiconductor memory device in accordance with example embodiments of the disclosed technology.

FIG. 4A is an equivalent circuit diagram illustrating a program operation of a unit cell in a semiconductor memory device in accordance with example embodiments, FIG. 4B is an equivalent circuit diagram illustrating an erase operation of a unit cell in a semiconductor memory device in accordance with example embodiments and FIG. 4C is an equivalent circuit diagram illustrating a read operation of a unit cell in a semiconductor memory device in accordance with example embodiments.

It is noted that the operation reliability is much improved when the bias voltage applied to the floating gate FG in the erase operation is greater than the bias voltage applied to the floating gate FG in the program operation and the bias voltage applied to the floating gate FC in the program operation is greater than the bias voltage applied to the floating gate FG in a read operation. Thus, the operation reliability can be improved when a coupling ratio of the floating gate FG in the erase operation is the highest and a coupling ratio of the floating gate FG in the read operation is the lowest. By controlling the bias voltage applied to the floating gat FG as described above depending on a type of the operation performed in the unit cell can secure a rapid program speed, a high program/erase cycle and a tolerance with respect to disturbance by the operations.

Hereinafter, a capacitance ratio between the first capacitor C1, the second capacitor C2 and the third capacitor C3 is assumed as 3:2:1. In this case, an area ratio between the first overlap area, the second overlap area and the third overlap area is assumed as 3:2:1 as well.

Referring to FIG. 4A, in the program operation of the unit cell 10, a first boost voltage Vpp may be applied to the word line WL and the erase line EL. A power voltage Vcc may be applied to the bit line BL and the selection line SEL. A ground voltage GND may be applied to the source line SL. For example, when the first boost voltage Vpp may be 5V and the power voltage Vcc may be 3.3V, the power voltage Vcc (3.3V) may be applied to the floating gate FG. The first boost voltage Vpp may be generated by pumping the power voltage Vcc.

For example, during the program operation, the power voltage Vcc (3.3V) may be applied to the floating gate FG by the first capacitor C1 and the third capacitor C3. Thus, a coupling ratio of the floating gate FG in the program operation may be about 67% by applying the bias voltage to the floating gate FG using the first capacitor C1 and the third capacitor C3 in the program operation. Thus, the power voltage Vcc (3.3V) may be applied to the floating gate FG. The coupling ratio of the floating gate FG may be a ratio of capacitances of the first and third capacitors C1 and C3 with respect to a total capacitance of the first to third capacitors C1, C2 and C3.

Referring to FIG. 4B, in the erase operation of the unit cell 10, a second boost voltage Vee may be applied to the erase line EL. The ground voltage GND may be applied to the word line WL, the bit line BL, the selection line SEL and the source line SL. For example, when the second boost voltage Vee may be 10V, 8.3V may be applied to the floating gate FG. The second boost voltage Vee may be generated by pumping the power voltage Vcc. The power voltage Vcc may be applied to the selection line SEL in the erase operation.

The applying of 8.3V to the floating gate FG may be caused by applying a bias voltage to the floating gate FG using the first capacitor C1 and the second capacitor C2 in the erase operation by the bias applying condition. Thus, a coupling ratio of the floating gate FG in the erase operation may be 83% by applying the bias to the floating gate FG using the first capacitor C1 and the second capacitor C2 in the program operation. Thus, about 8.3V may be applied to the floating gate FG.

Referring to FIG. 4C, in the read operation of the unit cell 10, the power voltage Vcc may be applied to the word line WL and the selection line SEL. A read voltage Vread may be applied to the bit line BL. The ground voltage GND may be applied to the source line SL. For example, when the power voltage Vcc may be 3.3V and the read voltage Vread may be 1V, 1.65V may be applied to the floating gate FG.

The applying of 1.65V to the floating gate FG may be caused by applying a bias voltage to the floating gate FG using the first capacitor C1 in the read operation by the bias applying condition. Thus, a coupling ratio of the floating gate FG in the read operation may be about 50% by applying the bias to the floating gate FG using the first capacitor C1 in the read operation. Thus, about 1.65V may be applied to the floating gate FG.

According to example embodiments, the bias voltage applied to the floating gate FG may be controlled based on the operations to improve the operational reliability. By configuring the first to third overlap areas to have different sizes, it is possible to secure the operational reliability such as the rapid program speed, the high program/erase cycle and the tolerance with respect to the disturbances in the operations.

In some implementations, the semiconductor memory device may perform the coupling dividing operation to provide the floating gate FG with the different bias voltages so that the semiconductor memory device may be applied to various electronic devices regardless of a minimum width of the semiconductor memory device. Thus, the semiconductor memory device may be used for various internet of things (IOT) and analog applications.

Figure 5:
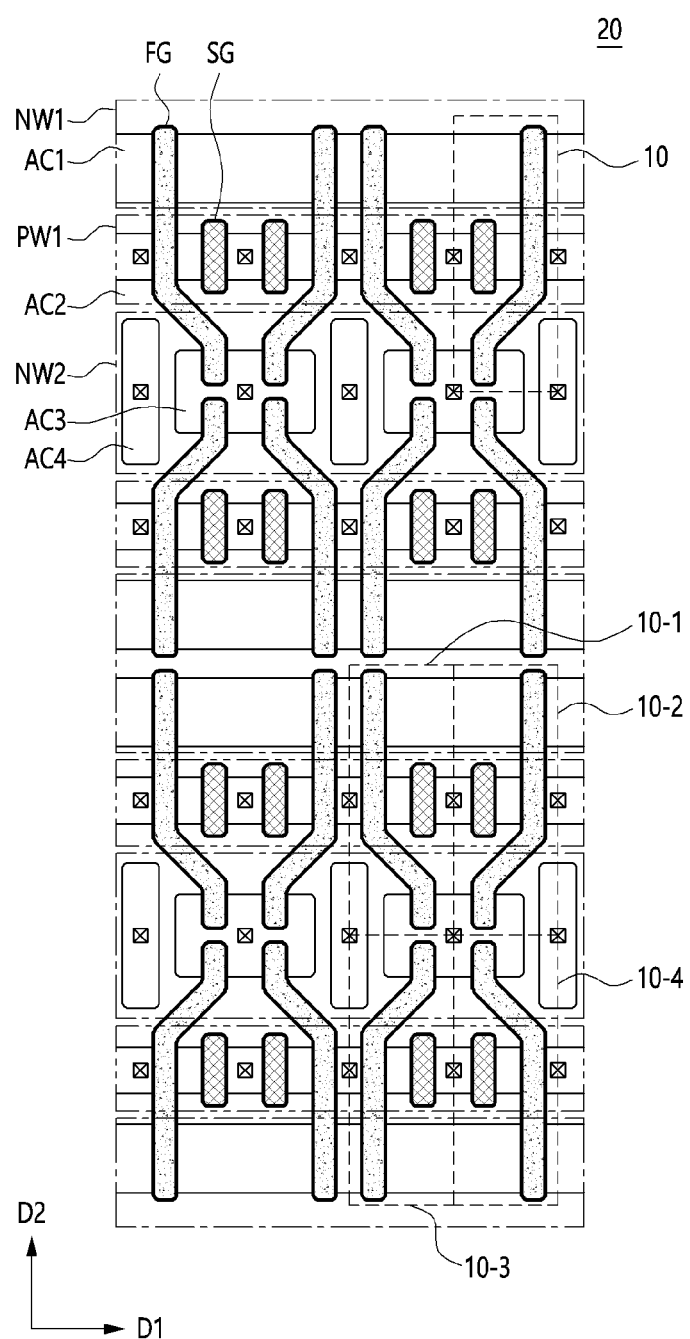
FIG. 5 is a plan view illustrating a cell array of a semiconductor memory device in accordance with example embodiments of the disclosed technology.
Figure 6:
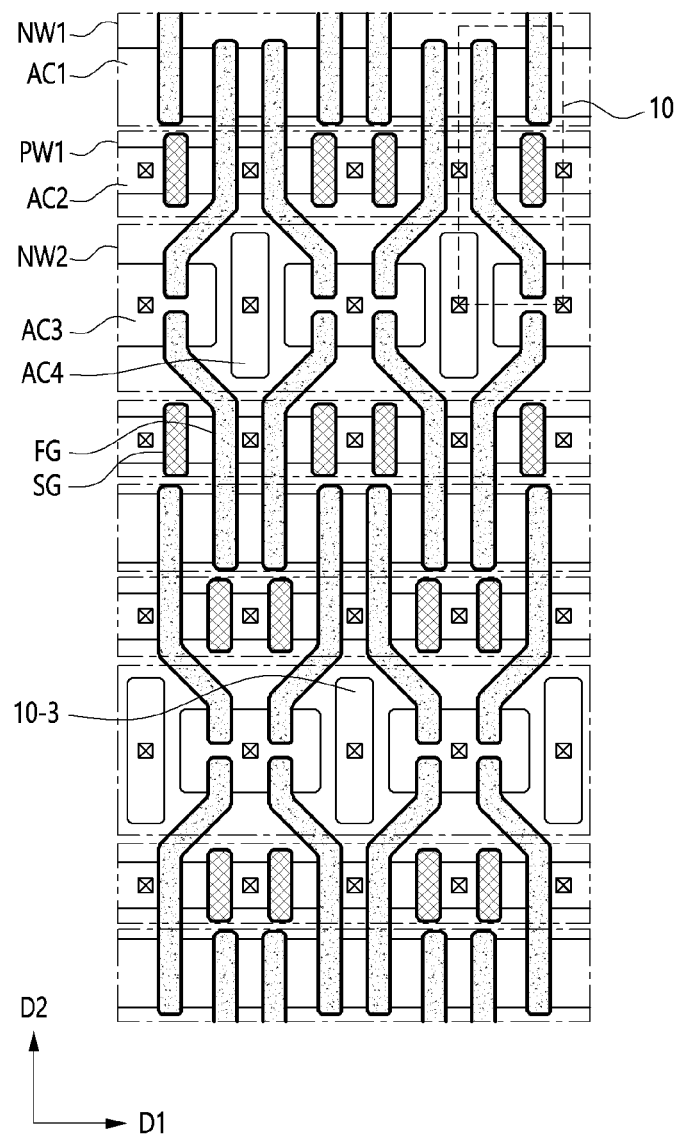
FIG. 6 is a plan view illustrating a cell array of a semiconductor memory device in accordance with example embodiments of the disclosed technology.

FIG. 5 is a plan view illustrating a cell array of a semiconductor memory device in accordance with example embodiments and FIG. 6 is a plan view illustrating a cell array of a semiconductor memory device in accordance with example embodiments.

Referring to FIG. 5, a cell array may include a plurality of unit cells 10. For example, the unit cells 10 may be arranged to be folded symmetrically with respect to the first and second directions D1 and D2. The unit cells 10 adjacent to each other along the first direction D1 may share the first active region AC1 and the second active region AC2 in common. For example, the four unit cells 10 adjacent to each other along the first and second directions D1 and D2 may have a structure configured to commonly share one third active region AC3. The fourth active region AC4 may be arranged between the third active regions AC3 along the first direction D1.

In some implementations, the four unit cells 10 are configured to commonly share the third active region AC3 in the cell array 20. For example, first to fourth unit cells 10-1, 10-2, 10-3 and 10-4 may be radially arranged with respect to the third active region AC3. The fourth active region AC4 extended in the second direction D2 may be arranged at both sides of the third active region AC3 in the first direction D1.

The first unit cell 10-1 and the second unit cell 10-2 that are adjacent to each other along the first direction D1 may have a symmetrical shape with respect to a boundary between the first unit cell 10-1 and the second unit cell 10-2. The first unit cell 10-1 and the second unit cell 10-2 may commonly share the first active region AC1 and the second active region AC2. The third unit cell 10-3 and the fourth unit cell 10-4 that are adjacent to each other along the first direction D1 may have a symmetrical shape with respect to a boundary between the third unit cell 10-3 and the fourth unit cell 10-4. The third unit cell 10-3 and the fourth unit cell 10-4 may commonly share the first active region AC1 and the second active region AC2.

The first unit cell 10-1 and the third unit cell 10-3 that are adjacent to each other along the second direction D2 may have a symmetrical shape with respect to a boundary between the first unit cell 10-1 and the third unit cell 10-3. The first unit cell 10-1 and the third unit cell 10-3 may not commonly share the first active region AC1 and the second active region AC2. The second unit cell 10-2 and the fourth unit cell 10-4 that are adjacent to each other along the first direction D1 may have a symmetrical shape with respect to a boundary between the second unit cell 10-2 and the fourth unit cell 10-4. The second unit cell 10-2 and the fourth unit cell 10-4 may not commonly share the first active region AC1 and the second active region AC2.

Referring to FIG. 6, the plurality of unit cells 10 may be arranged to be folded symmetrically with respect to the first direction D1 and the second direction D2 to form a cell array 30. The unit cells 10 that are adjacent to each other along the first direction D1 may have a structure configured to commonly share the first active region AC1 and the second active region AC2. The four unit cells 10 adjacent to each other along the first and second directions D1 and D2 may have a structure configured to commonly share one third active region AC3. The unit cells 10 adjacent to each other along the second direction D2 may commonly share the first active region AC1. Therefore, the size of the cell array may be effectively decreased.

According to example embodiments, the cell arrays 20 and 30 may include the alternately arranged wells having the different conductive types to secure the operational reliability of the unit cell 10 and to decrease the sizes of the cell arrays 20 and 30.

Further, the adjacent unit cells 10 may commonly share the active regions to secure the operational reliability and to more decrease the sizes of the cell arrays 20 and 30.

Only a few embodiments and examples are described. Enhancements and variations of the disclosed embodiments and other embodiments can be made based on what is described and illustrated in this patent document.

What is claimed is:

1. A semiconductor memory device comprising:
a semiconductor substrate;
a first well supported by the semiconductor substrate and structured to include a first active region and doped to exhibit a first conductive type;
a second well supported by the semiconductor substrate and arranged at a side of the first well, the second well structured to include a second active region and doped to exhibit a second conductive type different from the first conductive type;
a third well supported by the semiconductor substrate and arranged at a side of the second well, the third well structured to include a third active region and doped to exhibit the first conductive type of the first well;
a floating gate supported by the semiconductor substrate and positioned to overlap with the first active region, the second active region and the third active region; and
a selection gate supported by the semiconductor substrate and positioned to overlap with the second active region and arranged at a side of the floating gate,
wherein a second overlapping area between the second active region and the floating gate is larger than a third overlapping area between the third active region and the floating gate, and
wherein a line width of the floating gate overlapping with the first active region, a line width of the floating gate overlapping with the second active region and a line width of the floating gate overlapping with the third active region are uniform.

2. The semiconductor memory device of claim 1, wherein the second overlapping area is the same with a first overlapping area between the first active region and the floating gate.

3. The semiconductor memory device of claim 1, wherein the second overlapping area is smaller than a first overlapping area between the first active region and the floating gate.

4. The semiconductor memory device of claim 1, further comprising a fourth well formed in the third well, and
wherein the fourth well includes a fourth active region arranged at one side of the third active region which is doped to exhibit a conductive type different from the first conductive type, and
wherein sidewalls of the third active region and the fourth active region are arranged to face each other.

5. The semiconductor memory device of claim 1, wherein the first well, the second well and the third well have a linear shape extended in a first direction, the first well, the second well and the third well are arranged side by side along a second direction intersecting with the first direction, and the first well, the second well and the third well are electrically isolated from one another.

6. The semiconductor memory device of claim 1, wherein the first active region and the second active region have a linear shape extended in a first direction and the first active region and the second active region are arranged side by side along a second direction intersecting with the first direction.

7. The semiconductor memory device of claim 1, wherein the third active region has an island shape aligned with the selection gate along a second direction.

8. The semiconductor memory device of claim 1, wherein the floating gate and the selection gate have a linear shape and the floating gate has a bent portion aligned with the selection gate.

9. A semiconductor memory device comprising:
a memory transistor including a floating gate;
a selection transistor connected with the memory transistor in series, the selection transistor including a selection gate electrically connected to a selection line;
a bit line electrically connected to the memory transistor;
a source line electrically connected to the selection transistor;
a first capacitor defined by the floating gate and a word line;
a second capacitor defined by the floating gate of the memory transistor and the bit line; and
a third capacitor defined by the floating gate and an erase line,
wherein a capacitance of the first capacitor is larger than a capacitance of the third capacitor.

10. The semiconductor memory device of claim 9, wherein line widths of the floating gate forming the first to third capacitors are same.

11. The semiconductor memory device of claim 9, wherein a bias voltage applied to the floating gate in a program operation is determined using the first capacitor and the third capacitor.

12. The semiconductor memory device of claim 11, wherein, in the program operation, a ground voltage is applied to the source line, a first voltage higher than the ground voltage is applied to the bit line and the selection line, and a second voltage higher than the first voltage is applied to the word line and the erase line.

13. The semiconductor memory device of claim 9, wherein a bias voltage applied to the floating gate in an erase operation is determined using the first capacitor and the second capacitor.

14. The semiconductor memory device of claim 13, wherein, in the erase operation, a ground voltage is applied to the word line, the selection line, the bit line and the source line and a voltage higher than the ground voltage is applied to the erase line.

15. The semiconductor memory device of claim 9, wherein a bias voltage applied to the floating gate in a read operation is determined using the first capacitor.

16. The semiconductor memory device of claim 15, wherein, in the read operation, a ground voltage is applied to the source line and the erase line, a first voltage higher than the ground voltage is applied to the bit line, and a second voltage higher than the first voltage is applied to the word line and the selection line.

17. A semiconductor memory device including a cell array, the cell array including a plurality of unit cells having a matrix shape that is extended in a first direction and a second direction intersecting the first direction, each of the plurality of unit cells comprising:
- a first well including a first active region extended in the first direction and doped to exhibit a first conductive type;
- a second well arranged beside the first well in a second direction intersecting with the first direction, the second well including a second active region extended in the first direction and doped to exhibit a second conductive type that is opposite to the first conductive type of the first well;
- a third well arranged beside the second well in the second direction, the third well including a third active region and doped to exhibit a third conductive type that is the same with the first conductive type of the first well;
- a floating gate overlapping with the first active region, the second active region and the third active region, the floating gate extended in the second direction; and
- a selection gate overlapped with the second active region and arranged side by side with the floating gate along the first direction, and wherein a line width of the floating gate overlapping with the first active region, a line width of the floating gate overlapping with the second active region and a line width of the floating gate overlapping with the third active region are uniform and, wherein an overlapping area of the floating gate and the first active region, an overlapping area of the floating gate and the second active region and an overlapping area of the floating gate and the third active region are different.

18. The semiconductor memory device of claim 17, wherein a unit cell of the plurality of unit cells further comprises a fourth well doped to exhibit the second conductive type of the second well and arranged in the third well to face a sidewall of the third active region.

19. The semiconductor memory device of claim 17, wherein four adjacent unit cells are arranged to share the third active region, and the four adjacent unit cells configured to share the third active region have a symmetrical shape along the first direction and the second direction.

20. The semiconductor memory device of claim 17, wherein the plurality of unit cells adjacent to each other along the second direction share the first active region.

* * * * *